(12) United States Patent
Huang et al.

(10) Patent No.: US 12,396,120 B2
(45) Date of Patent: Aug. 19, 2025

(54) SERVER INCLUDING GRAPHICS PROCESSING ASSEMBLY

(71) Applicants: INVENTEC (PUDONG) TECHNOLOGY CORPORATION, Shanghai (CN); INVENTEC CORPORATION, Taipei (TW)

(72) Inventors: Wen-Long Huang, Shanghai (CN); Xishan Shen, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 201 days.

(21) Appl. No.: 18/223,973

(22) Filed: Jul. 19, 2023

(65) Prior Publication Data
US 2024/0314962 A1    Sep. 19, 2024

(30) Foreign Application Priority Data

Mar. 14, 2023    (CN) .......................... 202310246575.0

(51) Int. Cl.
H05K 7/14    (2006.01)
H05K 7/20    (2006.01)

(52) U.S. Cl.
CPC ......... *H05K 7/1487* (2013.01); *H05K 7/1489* (2013.01); *H05K 7/1492* (2013.01); *H05K 7/20172* (2013.01)

(58) Field of Classification Search
CPC .. H05K 7/1487; H05K 7/1489; H05K 7/1492; H05K 7/20172; G06F 1/18; G06F 1/181; G06F 1/183; Y02D 10/00
See application file for complete search history.

(56) References Cited

U.S. PATENT DOCUMENTS

| | | | |
|---|---|---|---|
| 11,528,824 B2* | 12/2022 | Linares Rivas | H05K 7/1427 |
| 11,596,073 B2* | 2/2023 | Zhang | G06F 1/187 |
| 2018/0098455 A1* | 4/2018 | Ni | H05K 7/20754 |

\* cited by examiner

*Primary Examiner* — Imani N Hayman
*Assistant Examiner* — Hung Q Dang
(74) *Attorney, Agent, or Firm* — Maschoff Brennan

(57) ABSTRACT

A server including a chassis, a motherboard, a graphic processing assembly and a storage assembly. The chassis includes a bottom plate and two side plates that together form an accommodation space. The two side plates are connected to two opposite sides of the bottom plate, respectively. The bottom plate has a front edge and a rear edge that are opposite to each other. The motherboard is disposed in the accommodation space. The graphic processing assembly is electrically connected to the motherboard and disposed in the accommodation space. The storage assembly is electrically connected to the motherboard and disposed in the accommodation space. The graphic processing assembly and the storage assembly are located closer to the front edge than the motherboard.

7 Claims, 5 Drawing Sheets

SERVER INCLUDING GRAPHICS PROCESSING ASSEMBLY

CROSS-REFERENCE TO RELATED APPLICATIONS

This non-provisional application claims priority under 35 U.S.C. § 119(a) on Patent Application No(s). 202310246575.0 filed in China, on Mar. 14, 2023, the entire contents of which are hereby incorporated by reference.

BACKGROUND OF THE INVENTION

Technical Field of the Invention

The invention relates to a server, more particularly to a server including at least one graphic processing assembly.

Description of the Related Art

In general, in order to store and process data, a motherboard, a disk drive assembly and a display card assembly are disposed in a chassis of a server. Further, the disk drive assembly is usually disposed at a front side of the chassis, and the display card assembly is usually disposed on the motherboard.

However, since components other than the display card assembly are disposed on the motherboard, the space around the motherboard is limited, thereby restricting the size of the display card assembly used in the server. For example, when the display card assembly includes ¾-length or full-length display card, the space around the motherboard is not enough for the installation of the display card assembly. Accordingly, the server is unable to support display card assembly with a large size, thereby reducing the flexibility of the configuration of the server.

SUMMARY OF THE INVENTION

The invention is to provide a server being able to support the graphic processing assembly with a large size, thereby improving the flexibility of the configuration of the server.

One embodiment of this invention provides a server including a chassis, a motherboard, a graphic processing assembly and a storage assembly. The chassis includes a bottom plate and two side plates that together form an accommodation space. The two side plates are connected to two opposite sides of the bottom plate, respectively. The bottom plate has a front edge and a rear edge that are opposite to each other. The motherboard is disposed in the accommodation space. The graphic processing assembly is electrically connected to the motherboard and disposed in the accommodation space. The storage assembly is electrically connected to the motherboard and disposed in the accommodation space. The graphic processing assembly and the storage assembly are located closer to the front edge than the motherboard.

According to the server disclosed by the above embodiments, since the storage assembly and the graphic processing assembly are located closer to the front edge than the motherboard, only the graphic processing assembly and the storage assembly are disposed on the front edge. With such configuration, the graphic processing assembly is not disposed on the motherboard. Thus, the components on the motherboard do not occupy the mounting space for the graphic processing assembly, and thus there is a larger mounting space at the front edge for the graphic processing assembly to be disposed therein. Therefore, when the graphic processing assembly includes a ¾-length or full-length display card, the graphic processing assembly is still allowed to be disposed at the front edge. That is, the server according to this invention supports the graphic processing assembly with a large size, thereby improving the flexibility of the configuration of the server.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
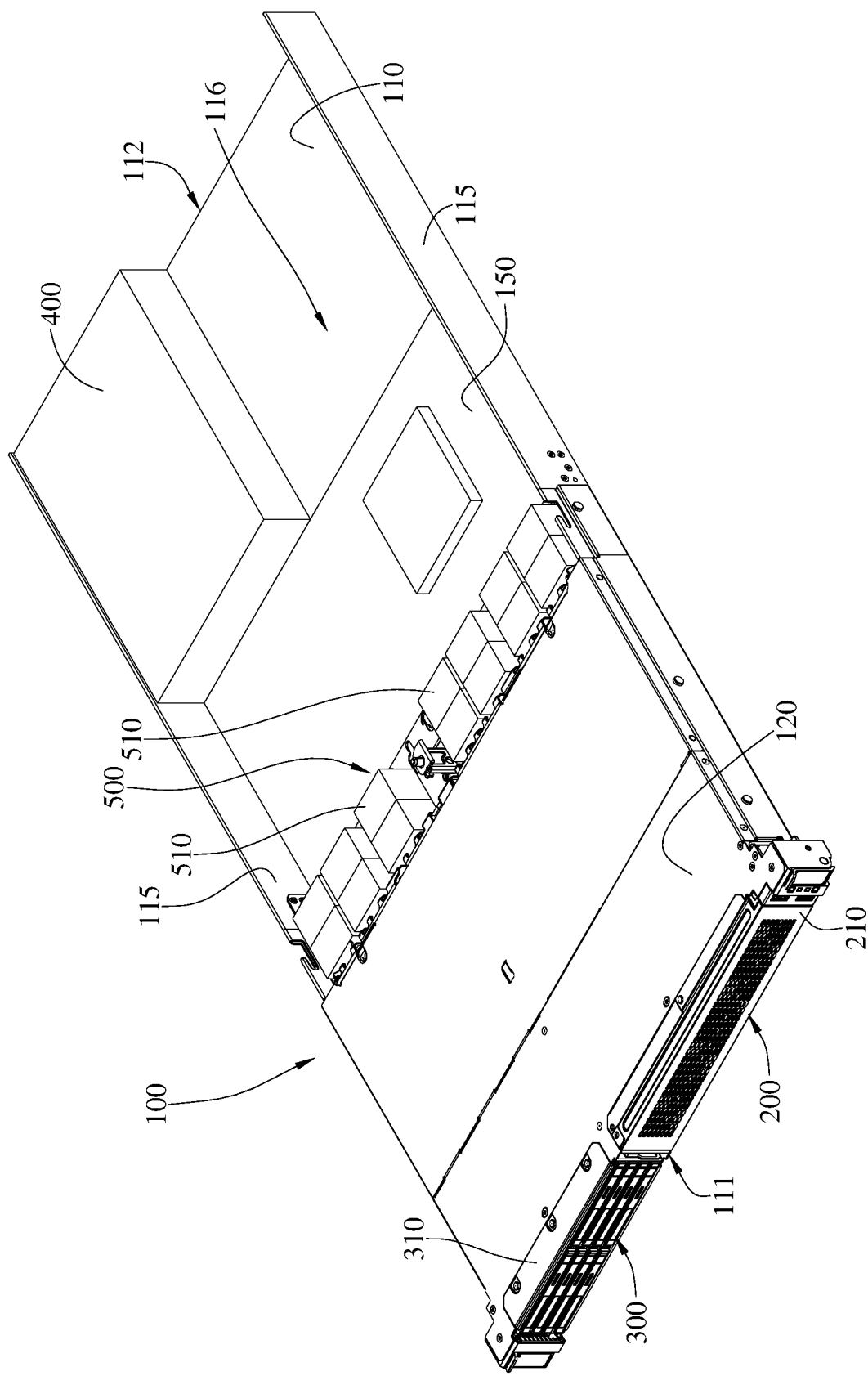
FIG. 1 is a perspective view of a server according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
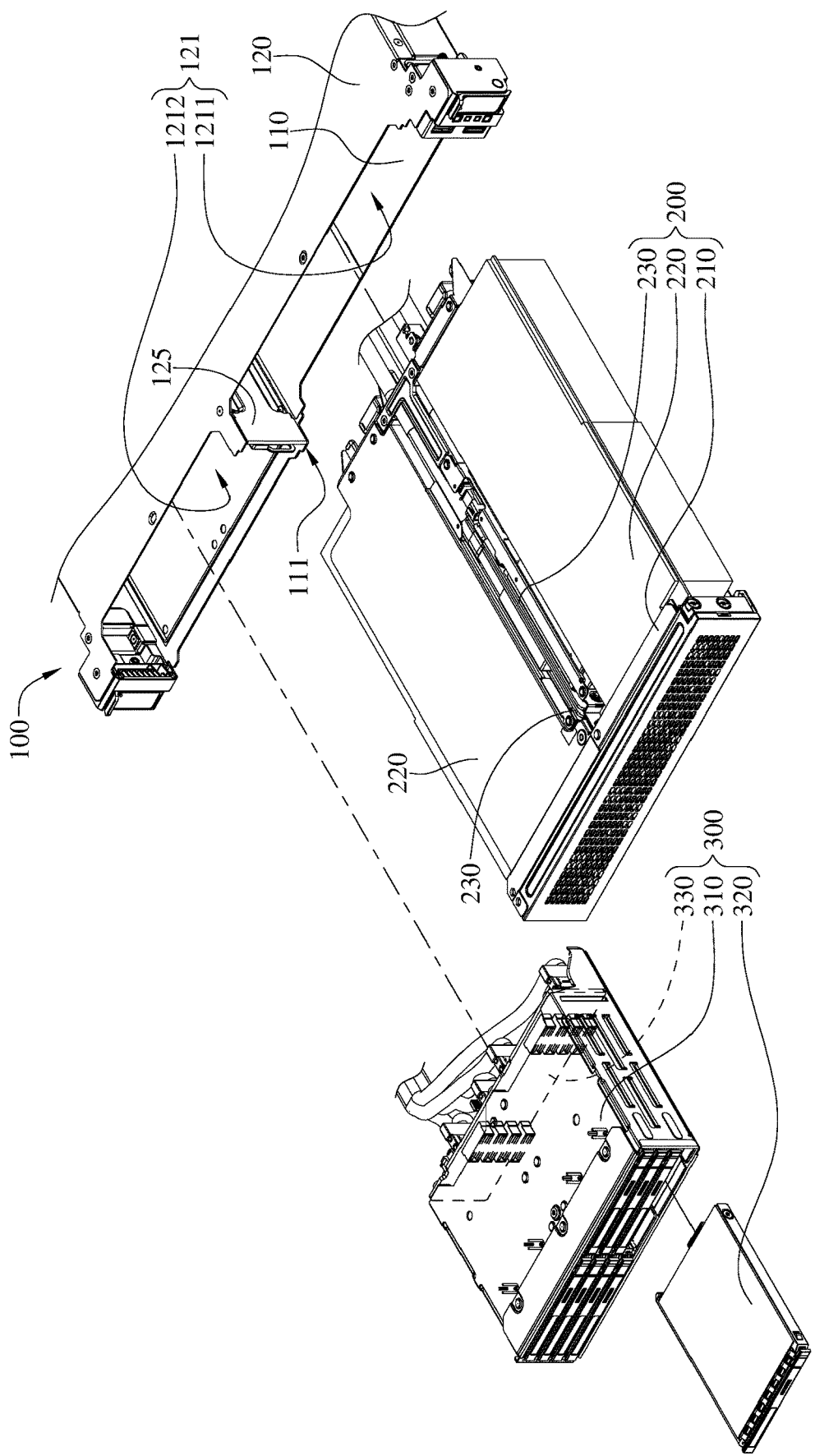
FIG. 2 is a partially enlarged exploded view of the server in FIG. 1.

Please refer to FIGS. 1 and 2. FIG. 1 is a perspective view of a server 10 according to a first embodiment of the invention. FIG. 2 is a partially enlarged exploded view of the server 10 in FIG. 1.

In this embodiment, the server 10 includes a chassis 100, a motherboard 150, a graphic processing assembly 200, a storage assembly 300, a power supply 400 and a fan assembly 500.

In this embodiment, the chassis 100 includes a bottom plate 110, two side plates 115, a top mounting plate 120 and a partition 125. The bottom plate 110 has a front edge 111 and a rear edge 112 that are opposite to each other. The two side plates 115 are connected to two opposite sides of the bottom plate 110, respectively. The two side plates 115 are located between the front edge 111 and the rear edge 112. The bottom plate 110 and the two side plates 115 together form an accommodation space 116. The top mounting plate 120 is fixed to the two side plates 115. At least a part of the top mounting plate 120 is located on sides of the two side plates 115 that are located farthest away from the bottom plate 110. The top mounting plate 120, the two side plates 115 and the bottom plate 110 together form a mounting space 121. Two opposite sides of the partition 125 are fixed to the top mounting plate 120 and the bottom plate 110, respectively. The partition 125 divides the mounting space 121 into a first mounting space 1211 and a second mounting space 1212. Note that in other embodiments, the chassis may not include the partition.

The motherboard 150 is disposed in the accommodation space 116. The graphic processing assembly 200 is electrically connected to the motherboard 150, and disposed in the accommodation space 116. In this embodiment, the graphic processing assembly 200 includes a first mounting bracket 210, two display cards 220 and two circuit boards 230. The first mounting bracket 210 is fixed to the chassis 100. The two display cards 220 and the two circuit boards 230 are disposed in the first mounting bracket 210. The two display cards 220 are electrically connected to the motherboard 150 via the two circuit boards 230, respectively. The two display cards 220 are, for example, single-wide or double-wide display cards with ¾ Length or Full Length. Note that in Other Embodiments, the Graphic Processing Assembly may merely include one display card. In other embodiments, the graphic processing assembly may not include the first mounting bracket, and the display cards and the circuit boards of the graphic processing assembly may be directly fixed to the chassis.

The storage assembly 300 is electrically connected to the motherboard 150, and disposed in the accommodation space 116. In detail, in this embodiment, the storage assembly 300 includes a second mount bracket 310, eight storage units 320 and a circuit board 330. The second mount bracket 310 is fixed to the chassis 100. The storage units 320 and the circuit board 330 are disposed in the second mount bracket 310. The storage units 320 are electrically connected to the motherboard 150 via the circuit board 330. In this embodiment, the storage assembly 300 is, for example, a disk drive assembly. Also, the storage units 320 are, for example, solid disk drives meeting Enterprise and Datacenter Solid-state drive Form Factor (EDSFF). Note that in other embodiments, the storage assembly may merely include one storage unit. In other embodiments, the storage assembly may not include the second mount bracket, and the storage units and the circuit board of the storage assembly may be directly fixed to the chassis.

As shown in FIG. 1, the graphic processing assembly 200 and the storage assembly 300 are located closer to the front edge 111 than the motherboard 150, and the front edge 111 is located closer to the graphic processing assembly 200 and the storage assembly 300 than the rear edge 112. As shown in FIG. 2, the mounting space 121 only accommodates the graphic processing assembly 200 and the storage assembly 300. In detail, the first mounting space 1211 only accommodates the graphic processing assembly 200, and the second mounting space 1212 only accommodates the storage assembly 300.

Figure 3:
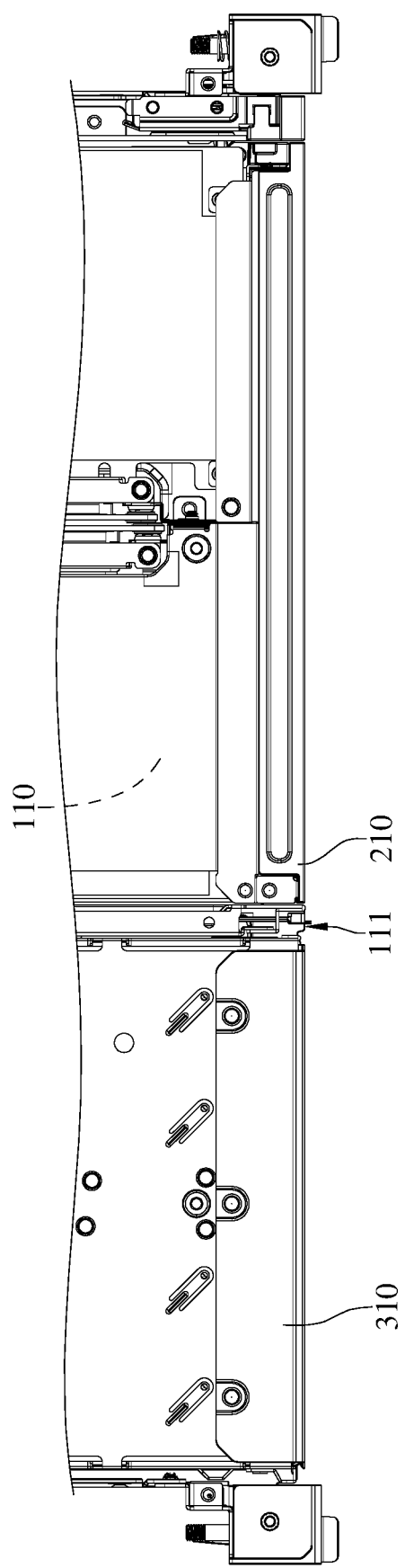
FIG. 3 is a partially enlarged top view of the server in FIG. 1 without a top mounting plate.
Figure 4:
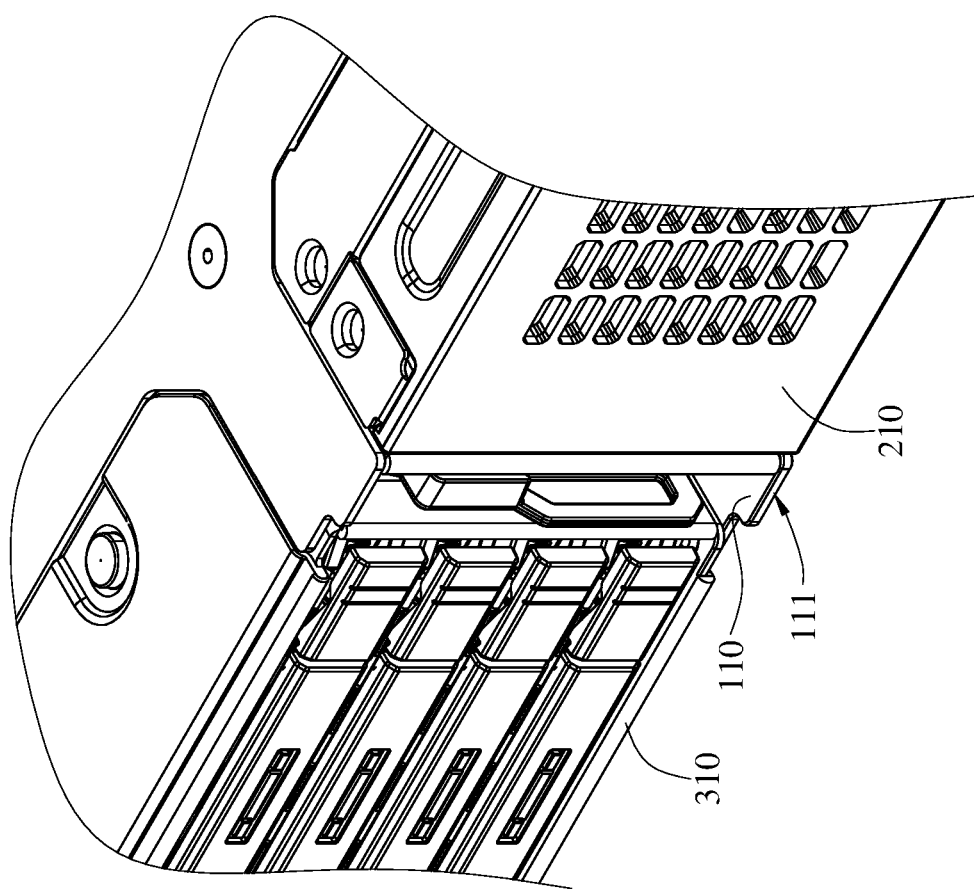
FIG. 4 is a partially enlarged perspective view of the server in FIG. 1.

Please refer to FIGS. 1, 3 and 4. FIG. 3 is a partially enlarged top view of the server 10 in FIG. 1 without the top mounting plate 120. FIG. 4 is a partially enlarged perspective view of the server 10 in FIG. 1. A side of the first mounting bracket 210 that is located farthest away from the motherboard 150 and a side of the second mount bracket 310 that is located farthest away from the motherboard 150 are aligned with the front edge 111 of the bottom plate 110.

Please refer to FIG. 1, the power supply 400 is disposed in the accommodation space 116, and electrically connected to the motherboard 150. The power supply 400 is located closer to the rear edge 112 than the graphic processing assembly 200 and the storage assembly 300. The fan assembly 500 includes a plurality of fans 510. The fans 510 are disposed in the accommodation space 116, and electrically connected to the motherboard 150. The fans 510 are located between the graphic processing assembly 200 and the motherboard 150. Note that in other embodiments, the server may not include the power supply and may obtain power from a power supply located outside the server. In other embodiments, the server may not include the fan assembly, and a fan located outside the server may blow a cold air into the server.

Hereinafter, other embodiments will be described. It should be noted that the reference numerals and a part of the contents in the previous embodiments are used in the following embodiment, in which identical reference numerals indicate identical or similar components, and repeated description of the same technical contents can be found in the previous embodiment and thus is omitted in the following embodiment.

Figure 5:
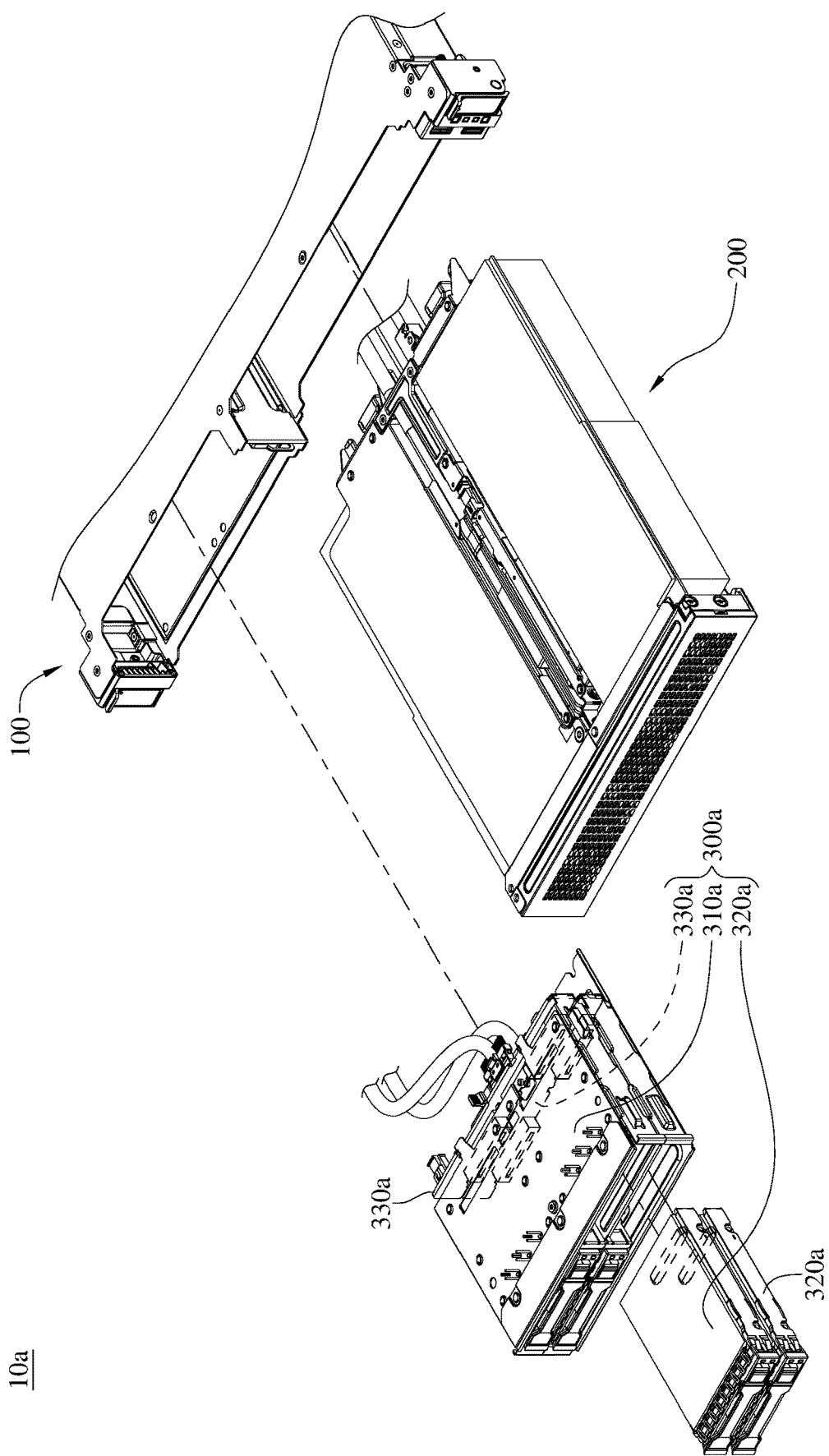
FIG. 5 is a partially enlarged exploded view of a server according to a second embodiment of the invention.

The invention is not limited by the configuration of the storage assembly. Please refer to FIG. 5. FIG. 5 is a partially enlarged exploded view of a server 10a according to a second embodiment of the invention. The difference between the server 10a according to this embodiment and the server 10 according to the first embodiment is merely that a storage assembly 300a according to this embodiment includes a second mount bracket 310a, four storage units 320a and two circuit boards 330a. The storage units 320a and the two circuit in boards 330a are disposed in the second mount bracket 310a. Two of the four storage units 320a are electrically connected to one of the two circuit boards 330a. The other two of the four storage units 320a are electrically connected to the other one of the two circuit boards 330a. In this embodiment, the storage assembly 300a is, for example, a disk drive assembly. Also, the storage units 320a are, for example, solid disk drives meeting Non-Volatile Memory Express (NVMe).

According to the server disclosed by the above embodiments, since the storage assembly and the graphic processing assembly are located closer to the front edge than the motherboard, only the graphic processing assembly and the storage assembly are disposed on the front edge. With such configuration, the graphic processing assembly is not disposed on the motherboard. Thus, the components on the motherboard do not occupy the mounting space for the graphic processing assembly, and thus there is a larger mounting space at the front edge for the graphic processing assembly to be disposed therein. Therefore, when the graphic processing assembly includes a ¾-length or full-length display card, the graphic processing assembly is still allowed to be disposed at the front edge. That is, the server according to this invention supports the graphic processing assembly with a large size, thereby improving the flexibility of the configuration of the server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server, comprising:
    a chassis, comprising a bottom plate and two side plates that together form an accommodation space, wherein the two side plates are connected to two opposite sides of the bottom plate, respectively, and the bottom plate has a front edge and a rear edge that are opposite to each other;
    a motherboard, disposed in the accommodation space;
    a graphic processing assembly, electrically connected to the motherboard and disposed in the accommodation space; and
    a storage assembly, electrically connected to the motherboard and disposed in the accommodation space;

wherein the graphic processing assembly and the storage assembly are located closer to the front edge than the motherboard;

wherein the graphic processing assembly comprises a first mounting bracket and at least one display card, the first mounting bracket is fixed to the chassis, and the at least one display card is disposed in the first mounting bracket and electrically connected to the motherboard;

wherein the storage assembly comprises a second mount bracket and at least one storage unit, the second mount bracket is fixed to the chassis, and the at least one storage unit is disposed in the second mount bracket and electrically connected to the motherboard;

wherein the chassis further comprises a top mounting plate, the top mounting plate is fixed to the two side plates, at least a part of the top mounting plate is located on sides of the two side plates that are located farthest away from the bottom plate, the top mounting plate, the two side plates and the bottom plate together form a mounting space, the mounting space only accommodates the graphic processing assembly and the storage assembly, and a side of the first mounting bracket that is located farthest away from the motherboard and a side of the second mount bracket that is located farthest away from the motherboard are aligned with the front edge of the bottom plate.

2. The server according to claim 1, wherein the front edge is located closer to the graphic processing assembly and the storage assembly than the rear edge.

3. The server according to claim 1, wherein the chassis further comprises a partition, two opposite sides of the partition are fixed to the top mounting plate and the bottom plate, respectively, the partition divides the mounting space into a first mounting space and a second mounting space, the first mounting space only accommodates the graphic processing assembly, and the second mounting space only accommodates the storage assembly.

4. The server according to claim 1, wherein the at least one storage unit comprises eight storage units, and the storage assembly meets Enterprise and Datacenter Solid-state drive Form Factor (EDSFF).

5. The server according to claim 1, wherein the at least one storage unit comprises four storage units, and the storage assembly meets Non-Volatile Memory Express (NVMe).

6. The server according to claim 1, further comprising a power supply, wherein the power supply is disposed in the accommodation space and electrically connected to the motherboard, and the power supply is located closer to the rear edge than the graphic processing assembly and the storage assembly.

7. The server according to claim 6, further comprising a fan assembly, wherein the fan assembly is disposed in the accommodation space and electrically connected to the motherboard, and the fan assembly is located between the graphic processing assembly and the motherboard.

\* \* \* \* \*